United States Patent [19]

Biggs

[11] 4,143,287
[45] Mar. 6, 1979

[54] PHOTO COUPLING LINE ISOLATION CIRCUIT

[75] Inventor: Ronald D. Biggs, Zionsville, Ind.

[73] Assignee: Bell Telephone Laboratories, Incorporated, Murray Hill, N.J.

[21] Appl. No.: 834,117

[22] Filed: Sep. 19, 1977

[51] Int. Cl.² .......................................... H03K 17/00
[52] U.S. Cl. ............................. 307/311; 307/DIG. 1; 307/254; 361/175
[58] Field of Search ................. 307/DIG. 1, 311, 254; 328/2; 361/173, 175; 250/551, 552, 211 J; 331/66

[56] References Cited

U.S. PATENT DOCUMENTS 3,665,224  4/1972  Kelsey ................................. 307/311
3,801,837  4/1974  Pease et al. ........................ 307/311

Primary Examiner—Stanley D. Miller, Jr.
Assistant Examiner—B. P. Davis
Attorney, Agent, or Firm—Harry L. Newman

[57] ABSTRACT

The circuit includes a signal input circuit having a light emitting diode that is optically coupled to a phototransistor in a signal output circuit comprising a noise suppression circuit and a Schmitt trigger circuit. The noise suppression circuit comprises a switch portion including a transistor switch and a timing portion including a capacitor. The transistor switch is connected in parallel with the capacitor, and in the quiescent condition of the line isolation circuit, the transistor switch is turned on so as to maintain the capacitor in a discharged condition. When the light emitting diode is illuminated by an input signal exceeding a particular threshold, the phototransistor is turned on, causing the transistor switch to turn off. The charging of the capacitor thereupon commences. The Schmitt trigger circuit is connected to the output of the noise suppression circuit, and if the signal is of sufficient amplitude and duration, the charge on the capacitor reaches the level necessary to operate the Schmitt trigger circuit. Otherwise, the capacitor is discharged by the turning on of the transistor switch responsive to the turning off of the phototransistor.

8 Claims, 4 Drawing Figures

PHOTO COUPLING LINE ISOLATION CIRCUIT

FIELD OF THE INVENTION

This invention relates to the field of photo coupling line isolation circuits. Within that field, this invention relates to circuits comprising a signal input circuit having an LED that generates optical signals responsive to the application of electrical signals to the input circuit and a signal output circuit electrically isolated from the input circuit including a phototransistor that generates electrical signals responsive to the optical signals of the LED. The output circuit further includes noise suppression circuitry connected to the phototransistor and a Schmitt trigger circuit for providing an output.

PRIOR ART

Such a circuit is disclosed in U.S. Pat. No. 3,801,837 issued to L. L. Pease et al on Apr. 2, 1974. In this circuit, the noise suppression circuitry consists of a resistor of relatively large ohm value connected in parallel with a capacitor. The noise suppression circuitry is connected across the base and emitter of the phototransistor, and the Schmitt trigger circuit is connected to the collector of the phototransistor. When the light from the LED impinges on the base of the phototransistor, instead of immediately triggering the flow of current through the phototransistor, it causes a charge to be built up on the capacitor. Then when the triggering level of the phototransistor is reached, the phototransistor becomes conductive. The capacitor is thereupon discharged, and the Schmitt trigger circuit changes state.

This circuit suffers from two deficiencies. First, with the noise suppression circuit connected across the base and emitter of the phototransistor, the threshold at which the phototransistor triggers is $V_{BE}$ dependent. As a result, the threshold is very temperature sensitive, and unless the circuit is used in a temperature controlled environment, its ability to distinguish between noise and signal will vary with temperature. Second, absent the turning on of the phototransistor, the capacitor of the noise suppression circuitry has only the parallel resistor to discharge through. Noise appearing at the input circuit can therefore result in an accumulation of charge on the capacitor. Consequently, the threshold voltage of the phototransistor could be reached even though a valid signal has not been applied to the input circuit. An invalid output signal would then result.

SUMMARY OF THE INVENTION

A circuit in accordance with the present invention avoids these deficiencies. In this circuit, the noise suppression circuitry is connected to the output of the phototransistor and activated by the turning on of the phototransistor. The noise suppression circuitry includes a transistor switch that is connected in parallel with the capacitor and is closed whenever the phototransistor is off whereby the capacitor is discharged, the switch being opened responsive to the turning on of the phototransistor. The Schmitt trigger circuit is connected to the output of the noise suppression circuitry.

By connecting the noise suppression circuitry between the phototransistor and the Schmitt trigger circuit, the effects of temperature on the ability of the noise suppression circuitry to distinguish between signal and noise is exceedingly diminished. Furthermore, by having the noise suppression circuitry include a transistor switch in parallel with the capacitor, which switch is turned on whenever the phototransistor is turned off, the accumulation of charge on the capacitor due to noise is eliminated. False activation of the Schmitt trigger circuit is thereby avoided.

DETAILED DESCRIPTION OF THE INVENTION

In telephone station equipment of the key telephone and telephone answering type, circuitry is provided to detect ringing signals, typically 20 or 30 Hertz, appearing on an associated telephone line. Since this type of station equipment commonly operates off of local power, it is necessary that there be isolation between the station equipment and the telephone line. In addition, since the ringing signals are generated at a central office that may be quite distant from the station equipment, the detection circuit must be able to distinguish between the low level ringing signals and other signals, such as 10 Hertz dial pulses, and noise, such as 60 Hertz interference, that may be present on the telephone line. Furthermore, since the ringing detector circuit is subject to ambient temperature conditions, it is important that this ability to distinguish between the ringing signal and the other signals and noise not be diminished by temperature changes.

Figure 1:
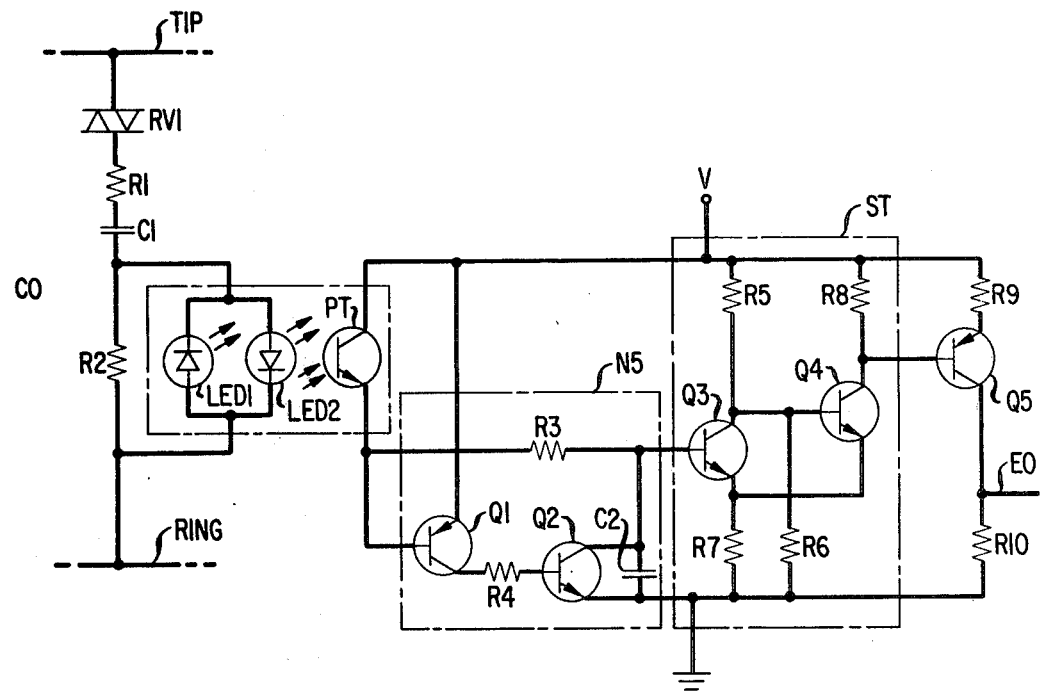
FIG. 1 is a schematic drawing of a circuit exemplary of the present invention.

The circuit shown in FIG. 1 achieves these objectives. In accordance with the present invention, the circuit comprises a signal input circuit connected to a telephone line and electrically isolated from a signal output circuit connected to the station equipment. The signal input circuit includes a pair of light emitting diodes LED 1 and LED 2 connected in parallel with and poled opposite to one another. The light emitting diodes LED 1 and LED 2 are connected in series with a varistor RV1, a resistor R1 and a capacitor C1 across the tip and ring conductors of the telephone line, these latter components being selected so as to provide approximately the same impedance as the ringer of a telephone set. R1 limits the current to the light emitting diodes in the event of excessive voltage on tip and ring. In addition, the light emitting diodes LED 1 and LED 2 are connected in parallel with a resistor R2 that shunts current from the light emitting diodes so that current flow through the input circuit must exceed a particular threshold for the light emitting diodes to generate sufficient illumination to be detected by the output circuit.

The output circuit includes a phototransistor PT, the base of which is optically coupled to both of the light emitting diodes LED 1 and LED 2, such as in a bipolar optical isolator unit. The collector of the phototransistor PT is connected to an operating potential source V while its emitter is connected to the input of a noise suppression circuit NS. The noise suppression circuit NS includes a timing portion comprising a resistor R3 and a capacitor C2 connected in series and providing a path between the input and a reference potential source, in this case ground. The noise suppression circuit NS also includes a switch portion comprising a pair of transistors Q1 and Q2. The base of the transistor Q1 is connected to the input of the noise suppression circuit NS, the emitter is connected to the operating potential source V, and the collector is connected through a resistor R4 to the base of the transistor Q2. The emitter and collector of the transistor Q2 are connected across the capacitor C2.

The junction of the resistor R3 and capacitor C2 is the output of the noise suppression circuit NS, and it is connected to the input of a Schmitt trigger circuit ST comprising a transistor Q3 that has its collector connected directly to the base of a transistor Q4 and through a resistor R5 to the operating potential source V. The collector of the transistor Q3 and the base of the transistor Q4 are connected through a resistor R6 to ground, while the emitters of both transistors are connected through a resistor R7 to ground. A resistor R8 connecting the collector of the transistor Q4 to the operating potential source V completes the Schmitt trigger circuit ST, the output of the circuit being taken at the collector of the transistor Q4.

A transistor Q5 in combination with resistors R9 and R10 provide an interface between the output of the Schmitt trigger circuit ST and digital logic circuitry responsive to the ringing detector. The transistor Q5 has its base connected to the output of the Schmitt trigger ST and its emitter connected through the resistor R9 to the operating potential source V. The collector of the transistor Q5 is connected through the resistor R10 to ground and terminal EO at the juncture therebetween provides the output to the associated logic circuitry.

In the quiescent condition of the signal output circuit, transistors Q1 and Q2, the switch portion of the noise suppression circuit SN, are on whereby the capacitor C2 is maintained in a discharged condition. In addition, transistor Q4 of the Schmitt trigger circuit ST is on whereby transistor Q5 is on and provides a logic 1 signal at the terminal EO.

When a voltage is applied across the signal input circuit that generates a current that exceeds the threshold established by the resistor R2, one of the light emitting diodes LED 1 or LED 2 is illuminated and turns the phototransistor PT on. The operating potential source V is then connected through the phototransistor PT to the base of the transistor Q1 of the noise suppression circuit SN. As a result, the transistor Q1 and thereby transistor Q2 are turned off, and the short across the capacitor C2 is removed. At the same time, the operating potential source V is connected through the phototransistor PT and the resistor R3 to the capacitor C2, and the capacitor commences to charge.

If this voltage applied to the signal input circuit remains for a sufficient duration for the charge on the capacitor C2 to reach the operating threshold of the Schmitt trigger circuit ST, transistor Q3 turns on and transistor Q4 turns off. Transistor Q5 is thereby turned off, and a logic 0 signal is provided at the terminal EO. In addition, the voltage across the capacitor C2 drops to the voltage across resistor R7 and the base to emitter of transistor Q3, and the current through resistor R3 is sufficient to retain the Schmitt trigger circuit ST in the operating condition. The Schmitt trigger circuit ST then remains operated until the voltage applied across the input circuit drops to a level where the phototransistor PT turns off.

Any time that the signal applied to the signal input circuit drops below the thresholds established by the resistor R2, the phototransistor PT turns off. The transistors Q1 and Q2 thereupon turn on, and the capacitor C2 is completely discharged. Consequently, there is no residue of charge remaining on the capacitor C2 the next time the phototransistor PT is turned on, and the duration it must remain on for the charge of the capacitor C2 to reach the operating threshold of the Schmitt trigger circuit ST is unaffected by previous signals applied to the signal input circuit.

Furthermore, the time that the phototransistor PT must remain on in order for the charge on the capacitor C2 to reach the operating threshold of the Schmitt trigger circuit ST is essentially unaffected by temperature changes. This is true for two reasons. First, the charging time of the capacitor C2 is not dependent upon silicon junctions but upon an RC time constant. The voltage drop across the phototransistor PT is in the order of 0.1 of a volt; and therefore, by selecting an operating voltage that is relatively large with respect to this voltage drop, such as 12 volts, any variation in this voltage drop as a result of temperature changes will have very little effect on the voltage applied to the resistor R3 and capacitor C2. Then by selecting a resistor and capacitor that have a very low temperature coefficient, such as a tantalum resistor and a Mylar capacitor, a very low temperature sensitivity is achieved.

Second, the operating threshold of the Schmitt trigger circuit ST is dependent upon the differential between the base to emitter voltage drop of transistor Q4 and the base to emitter voltage drop of transistor Q3 and upon the voltage ratio of resistors R5 and R6. Since the changes in the base to emitter drops of the transistors Q3 and Q4 as a result in changes in temperature essentially track each other, the differential remains essentially the same. Then by again selecting resistors that have low temperature coefficient, a very low temperature sensitivity is achieved.

When the circuit of the present invention is used as a ringing detector, the component values are selected so that the phototransistor PT must remain on for a time duration of between 8.2 and 12 milliseconds in order for the charge on the capacitor C2 to reach the operating threshold of the Schmitt trigger circuit ST. In addition, the threshold established by the resistor R2 that must be exceeded in order for the phototransistor TR to turn on is approximately 3 milliamps. Thus, it is seen that the components of the circuits do not need to be held to exceedingly close tolerances.

Figure 2:
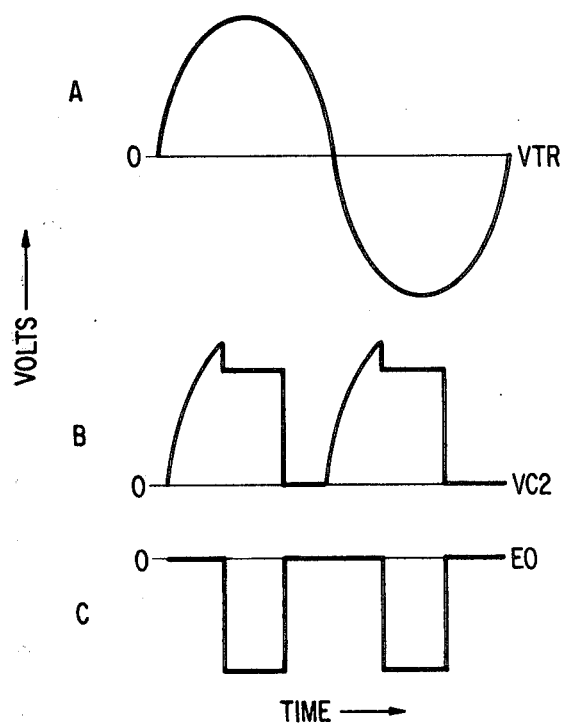
FIG. 2A through C shows typical input, intermediate, and output voltage wave forms as a function of time.

On short loops, the typical 20 Hertz ringing signal has a RMS voltage in excess of 80 volts, and as shown in FIG. 2A, this produces a relatively steep voltage wave form across the tip and ring conductors of the telephone line. As a result, in each half cycle, the current threshold established by the resistor R2 is quickly exceeded, turning on the phototransistor PT and initiating the charging of the capacitor C2. As shown in FIG. 2B, with the above charging time constant, the threshold of the Schmitt trigger circuit ST is readily reached within the time duration of one-half cycle providing a shift in the logic output at the terminal EO as shown in FIG. 2C.

On long loops where several telephone sets and thereby their ringers are connected in parallel across a telephone line, the 20 hertz ringing voltage may drop as low as 42 volts. The amplitude of the signal is then reduced, and a longer time is required before the current threshold established between resistor R2 is exceeded. However, even if the charging time constant falls at the high end of the range, i.e., 12 milliseconds, the ringing signal still causes the Schmitt trigger circuit ST to operate on each half cycle.

However, 60 Hertz interference appearing on the telephone line has a half cycle time of 8.3 milliseconds, and since some time is taken in exceeding the current threshold established by the resistor R2, the capacitor C2 never charges up to the operating threshold of the Schmitt trigger circuit ST. Similarly, dial pulses applied to the telephone line, although typically having a 10 Hertz rate, do not exceed the current threshold of the resistor R2 for the 8.3 millisecond minimum. Consequently, the ringing detector also does not respond to these signals. Thus, it is seen that the circuit of the present invention is able to distinguish between a valid ringing signal and other signals and noise appearing on a telephone line.

Although but one embodiment has been described in detail, it is to be understood that it is merely illustrative of the principles of the invention. Various modifications may be made thereto by persons skilled in the art without departing from the spirit and scope of the invention.

What is claimed is:

1. A photo coupling line isolation circuit comprising: a signal input circuit including an LED that generates optical signals responsive to the application of electrical signals to the input circuit,
a signal output circuit electrically isolated from the input circuit including a phototransistor that generates electrical signals responsive to the optical signals of the LED, noise suppression circuitry comprising capacitor means connected to the phototransistor, and a Schmitt trigger circuit for providing an output characterized in that
   the noise suppression circuitry is connected to the output of the phototransistor and activated by the turning on of the phototransistor,
   the noise suppression circuitry includes a switch portion that is connected in parallel with the capacitor means and is closed whenever the phototransistor is off whereby the capacitor means is discharged, the switch being opened responsive to the turning on of the phototransistor, and
   the Schmitt trigger circuit is connected to the output of the noise suppression circuitry.

2. A circuit as in claim 1 wherein a phototransistor has its collector connected to an operating potential source, and the noise suppression circuitry is connected between the emitter of the phototransistor and a reference potential source.

3. A circuit as in claim 1 wherein the signal input circuit includes a resistor in parallel with the light emitting diode, the resistor shunting current from the light emitting diode so that current flow through the input circuit must exceed a particular threshold for the light emitting diode to generate sufficient illumination to be detected by the signal output circuit.

4. A circuit as in claim 3 wherein the signal input circuit includes a pair of light emitting diodes connected in parallel and poled opposite to one another.

5. A circuit as in claim 1 wherein the switch portion of the noise suppression circuitry includes a transistor having its emitter and collector connected across the capacitor means.

6. A circuit as in claim 1 wherein the switch portion of the noise suppression circuitry comprises a first and second transistor, the base of the first transistor is connected to the output of the phototransistor, the emitter of the first transistor is connected to an operating potential source, the collector of the first transistor is connected through a resistor to the base of the second transistor, and the emitting and collector of the second transistor are connected across the capacitor means.

7. A circuit as in claim 6 wherein the noise suppression circuitry includes a timing portion connected to the output of the phototransistor, the timing portion comprising a resistor connected in series with the capacitor means and providing a path between the output of the phototransistor and a reference potential source, the junction between the resistor and the capacitor means providing the output of the noise suppression circuitry.

8. A circuit as in claim 1 further including an interface circuit connected to the output of the Schmitt trigger circuit for providing a logic 0 or 1 signal responsive to the condition of the Schmitt trigger circuit.

* * * * *